US010672808B2

(12) United States Patent
 Gaebler (10) Patent No.: US 10,672,808 B2
(45) Date of Patent: Jun. 2, 2020

(54) OPTICAL SENSOR HAVING TWO TAPS FOR PHOTON-GENERATED ELECTRONS OF VISIBLE AND IR LIGHT

(71) Applicant: X-FAB Semiconductor Foundries GmbH, Erfurt (DE)

(72) Inventor: Daniel Gaebler, Ortsteil Sulzbach (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 16/532,570

(22) Filed: Aug. 6, 2019

(65) Prior Publication Data

US 2019/0363113 A1 Nov. 28, 2019

Related U.S. Application Data

(62) Division of application No. 15/363,665, filed on Nov. 29, 2016, now Pat. No. 10,411,049.

(30) Foreign Application Priority Data

Nov. 29, 2015 (DE) .......................... 10 2015 120 702
Sep. 25, 2016 (DE) .......................... 10 2016 118 065

(51) Int. Cl.
 *H01L 27/144* (2006.01)
 *H01L 27/146* (2006.01)
 (Continued)

(52) U.S. Cl.
 CPC .... *H01L 27/1443* (2013.01); *H01L 27/14643* (2013.01); *H01L 27/14647* (2013.01);
 (Continued)

(58) Field of Classification Search
 CPC ........... H01L 27/1443; H01L 27/14643; H01L 27/14647; H01L 27/14649; H01L 27/1465;
 (Continued)

(56) References Cited

U.S. PATENT DOCUMENTS 10,411,049 B2 9/2019 Gaebler
2003/0189237 A1 10/2003 Koizumi
(Continued)

FOREIGN PATENT DOCUMENTS

DE 1020151207028 11/2015
DE 1020161180653 9/2016
(Continued)

OTHER PUBLICATIONS

Office Action; German patent application No. 102016123037.5; dated Jan. 23, 2019; German Patent Office; Munich, Germany.
(Continued)

*Primary Examiner* — Matthew E Warren
(74) *Attorney, Agent, or Firm* — Stevens & Showalter LLP (57) ABSTRACT

An optical sensor in which photo currents generated by light in the visible and infrared wavelength ranges are to be tapped separately at pn junctions of active regions. The active regions include n- or p-doping and are formed in a p-substrate 52. The optical sensor comprises a surface-near first active region 12, and a second active region 14 subjacent to the first active region 12 and forming together with the first active region 12 a pn junction 22 that is short-circuited. A third active region 20 is subjacent to the second active region 14 and forming together with the second active region a further pn junction 23. Together with a fourth active region 24 subjacent to the second active region 20, a further pn junction 25, 29 is formed together with the third active region 20 and the substrate 52.

11 Claims, 11 Drawing Sheets

(51) Int. Cl.
*H01L 31/02* (2006.01)
*H01L 31/0224* (2006.01)
*H01L 31/103* (2006.01)

(52) U.S. Cl.
CPC .. *H01L 27/14649* (2013.01); *H01L 27/14652* (2013.01); *H01L 31/02005* (2013.01); *H01L 31/022408* (2013.01); *H01L 31/103* (2013.01)

(58) Field of Classification Search
CPC ......... H01L 27/14652; H01L 31/02005; H01L 31/022408; H01L 31/101; H01L 31/1013
USPC ................ 257/290, 292, 440, 461, 462, 463
See application file for complete search history.

(56) References Cited

U.S. PATENT DOCUMENTS

| | | | |
|---|---|---|---|
| 2004/0061152 A1* | 4/2004 | Kashiura | ............ H01L 27/1443 257/292 |
| 2004/0178466 A1 | 9/2004 | Merrill et al. | |
| 2009/0243019 A1 | 10/2009 | Kawai | |
| 2013/0341692 A1 | 12/2013 | Tseng et al. | |
| 2017/0294474 A1* | 10/2017 | Uchihashi | ................ G01J 1/42 |

FOREIGN PATENT DOCUMENTS

| | | |
|---|---|---|
| DE | 102016123037 A1 | 6/2017 |
| JP | 2001326378 A | 11/2001 |
| JP | 2013229436 A | 11/2013 |

OTHER PUBLICATIONS

Election/Restriction Requirement; U.S. Appl. No. 15/363,665; dated Nov. 20, 2017; United States Patent and Trademark Office; Alexandria, Virginia.

Non-Final Offce Action; U.S. Appl. No. 15/363,665; dated Jun. 15, 2018; United States Patent and Trademark Office; Alexandria, Virginia.

Notice of Allowance and Fees Due; U.S. Appl. No. 15/363,665; dated Dec. 28, 2018; United States Patent and Trademark Office; Alexandria, Virginia.

* cited by examiner

Fig. 1

Fig. 2
Light collecting areas

OPTICAL SENSOR HAVING TWO TAPS FOR PHOTON-GENERATED ELECTRONS OF VISIBLE AND IR LIGHT

CROSS REFERENCE TO RELATED APPLICATIONS

This application is a divisional of U.S. patent application Ser. No. 15/363,665, filed Nov. 29, 2016, and entitled "OPTICAL SENSOR HAVING TWO TAPS FOR PHOTON-GENERATED ELECTRONS OF VISIBLE AND IR LIGHT", which claims priority to German patent application number DE102016118065.3, filed Sep. 25, 2016, and German patent application number DE 102015120702.8, filed Nov. 29, 2015, the entire disclosures of each of which are hereby incorporated by reference herein.

FIELD OF THE INVENTION

The disclosure relates to optical sensors. Photo currents generated by light in the visible wavelength range and light in the infrared wavelength range may be tapped separately at pn junctions of active regions formed in a p-substrate.

BACKGROUND OF THE INVENTION

For regulating lamps and displays depending on the environmental brightness sensors are required that simulate the brightness sensitivity of the human eye.

Moreover, some displays are switched off as soon as an object comes too close to the display, for instance when a mobile phone is attached to the ear or is put into a bag of a user. The display also should be switched off when a user of the device including the display is too far away, for instance, when the user leaves the workplace and the monitor serving as a display is no longer viewed. This proximity function is mostly realized by an infrared LED in combination with a photodiode, wherein the photodiode detects the reflected part of the IR light, thereby allowing tracking whether an object is near the sensor based on the photo current.

Since the human eye is insensitive both for shortwave (smaller than 400 nm of wavelength) and long wave (greater than 780 nm) radiation, whereas an ideal silicon pn junction is sensitive for any wavelengths less than the silicon bandgap (1.2 eV=1100 nm), it has to be guaranteed that the photon or photo-generated electrons of short and long wavelengths are not detected by the sensor.

U.S. Pat. No. 8,274,487 B2 (by Aptina) relates to color light detection, however without filter, which is described as disadvantageous for the sensitivity. U.S. Pat. No. 9,019,251 B2 (by NXP) is concerned with light detection by two different sensors detecting different wavelengths of the environmental light, wherein the two photo currents are combined in a non-linear manner. The non-existing "synchronism" of the sensitivity of a silicon eye and a human eye is referred to, in paragraph [04].

SUMMARY OF THE INVENTION

It is an object of the invention to propose a sensor that mainly provides the photo current generated by photo-generated electrons of the visible (by humans) light, while providing a photo current generated by photo-generated electrons of the non-visible infrared light separately without resorting to several optical sensor elements positioned side-by-side and/or spectrally differently generated photo currents (a compensation thereof).

This is achieved by an optical sensor according to a first embodiment, wherein photo currents generated by light in the visible wavelength range and by light in the infrared wavelength range can be separately tapped at pn junctions of active regions formed in a p-substrate.

According to the optical sensor as described herein, the photo currents are provided in positive flow direction. However, any of the described dopings may be inverted with respect to their types (p-doping instead of n and n-doping instead of p) such that the sensor provides negative photo currents. The embodiments are not restricted to silicon as a basic material of the optical sensors; for the implementation other materials, for instance GaAs or other semiconductors, may also be used.

The optical sensor comprises a surface-near first active region having high p+ doping that decreases in or into the depth of the sensor and a second active region subjacent to the first active region and having an n-doping that decreases in the depth of the sensor and forming a first pn junction with the first active region. The first pn junction is short-circuited.

A third active region subjacent to the second active region as provided and includes a p-doping that decreases towards the second active region and forms together with the second active region a second pn junction, whose photo current—generated by light in the visible wavelength range—is present at a first cathode, for instance a contact of the cathode, and can be tapped there.

A fourth active region subjacent to the third active region and having an n-doping that decreases in the depth of the sensor and forming, together with the third active region and the substrate, a third pn junction, whose photo current—generated by light in the infrared wavelength range—is present at the second cathode, for instance, a contact of the second cathode, and can be tapped there. An anode, for instance comprising a terminal region, is connected to the p-substrate surrounding the active regions. Also, the fourth active region forms together with the substrate a (fourth) pn junction that is connected, in terms of potential, in parallel to the third pn junction and may provide its photo current also at the second cathode. In this manner, an extended pn junction is formed around the n-doped fourth active region, which may represented by two photodiodes, one thereof towards the third active region (third pn junction) and another one towards the surrounding p-substrate (fourth pn junction). These regions (fourth active region and substrate) are at the same potential that may be or is coupled to the anode. In the inventive sensor the spectral characteristics of the two currents are achieved via accordingly designed doping profiles, that is, two currents as the current tapped by/via the first cathode, in particular by the first contact of the first cathode, at the second pn junction and the current tapped by/via the second cathode, in particular by a second contact of the second cathode at the third pn junction. These are considered as a profile of a doping concentration so that the term "doping" as used herein should be understood as doping concentration.

By means of the surface-near-arranged first pn junction it is achieved that the photo current of the photons absorbed near the surface is cancelled. Due to the absorption characteristics of silicon this is equivalent to the suppression of any shortwave photo-generated charge carriers.

Due to the high doping concentration the first pn junction merely has a reduced depletion width and therefore a reduced capture depth for photo-generated (light induced) charge carriers. Since the doping profile (profile of the doping concentration) of the first n-doped region decreases in the depth, only charge carriers above the lower depletion edge of the first pn junction are converted into photo current.

Therefore it is ensured that electron-hole-pairs of photons absorbed above this edge either recombine directly or, when entering the area of the depletion zone, will be eliminated by the short-circuit of the first pn junction. The lower limit of the charge carriers remaining for detection is adjusted via the depth of the pn junction in combination with the doping profile and the width of the depletion zone.

The second pn junction collects photons of the visible spectrum. In the second pn junction the visible and long-wave photons having an increased penetration depth in, for instance, silicon or other semiconductors are absorbed, since in the area of the first pn junction any shortwave photons have already been absorbed.

The longwave photons penetrate into the depth of the third (and the fourth) pn junction, since the higher-energy photons are already absorbed. The third and fourth pn junctions collect any charge carriers entering, during their lifetime, the area of its depletion zone. Due to said doping profiles and the arrangement of the stacked pn junctions the desired photo currents may be obtained from the n-regions (they can be tapped as positive photo current).

The decreasing doping profile of the second active region provides for the generated charge carriers to perform a directed movement towards the second pn junction caused by a small electric field. This results in a high collection efficiency even though the depletion zone of the second pn junction as not as wide as the penetration depth of the visible photons.

This also applies to the decreasing doping profile—facing the pn junction—of the third active region. The charge carriers, which will still be generated at this point, recombine or will be collected in the two pn junctions located below. They are available at the second cathode as photo current, in particular at an associated (electrically conducting) contact thereof.

In one specific implementation of the invention a polysilicon layer is provided—at least partially covering the first active region, which is insulated with respect to the active regions of the sensor. It may replace the first pn junction or may be provided in addition thereto.

In a further embodiment of the invention the polysilicon layer that is insulated with respect to the active regions of the sensor covers the first active region completely.

In a further embodiment of the invention the polysilicon layer is a first polysilicon layer—continuously covering the first active region, which is insulated with respect to the active regions of the sensor.

Advantageously, by means of the above-mentioned polysilicon layer the limit of the wavelength of photons may be affected, below which the photons will be absorbed and no longer contribute to the photo current.

In a further embodiment of the invention the first pn junction is located at 0.2 µm to 0.5 µm as measured from the topside (the surface) of the active portion of the sensor.

In a further embodiment of the invention the peak doping concentration of the doping profile of the third active region is located at 3 µm to 5 µm and defines a limit for the proportion of the visible photons, below which the proportion of the visible photons is negligible.

According to a different embodiment, an optical sensor, in which photo currents generated by light in the visible wavelength range and light in the infrared wavelength range are separately tapped at pn junctions of active regions formed in a p-substrate, comprises a continuously arranged polysilicon layer that is insulated with respect to an active region subjacent to the polysilicon layer and which has an n-doping that decreases in the depth of the sensor. Such a polysilicon layer is present as a gate level in any CMOS process.

A further active region is provided below the active region, which has a p-doping decreasing towards the active region and forms together with the active region a pn junction, whose photo current generated by light in the visible wavelength range, is present (and therefore can be tapped) at a first cathode, in particular at a first (electrically conductive) contact as portion of the first cathode.

A still further active region subjacent to the active region is provided, which includes an n-doping decreasing in the depth of the sensor and forms together with the p-substrate a pn junction, whose photo current generated by light in the infrared wavelength range, can be tapped at a second cathode, in particular at an electrically conductive second contact as portion of the second cathode.

In particular, independent of photo current—generated in the pn junction between the active region and the further active region.

An anode is connected to the p-substrate surrounding the active regions via a terminal region that is a part of the anode.

The pn junction between the still further active region and the p-substrate, in which further active regions are embedded, and the pn junction formed between the two lower active regions may be electrically connected in parallel.

When said polysilicon layer is positioned above the light sensitive area of the sensor a shift of the shortwave suppression wavelengths into the visible range is obtained, since the high-energy photons are already proportionally absorbed in this layer, and since this layer is electrically isolated from the silicon by the gate oxide the charge carriers thus generated cannot contribute to the photo current.

In this manner the shortwave portion of the photons may be preferably shielded in. A polysilicon layer having a thickness of 100 nm to 300 nm is well adapted and appropriate to absorb the UV proportion of the incident light.

According to a third embodiment, an optical sensor, in which photo currents generated by light in the visible wavelength range and light in the infrared wavelength range may be tapped at pn junctions of active regions formed in a p-substrate, comprises a surface-near first active region having a p-doping; a second active region subjacent to the first active region and having an n-doping that decreases in the depth of the sensor, and forming a first pn junction that is short-circuited with the first active region.

Also, there is provided a third active region subjacent to the second active region and having a p-doping that decreases towards the second active region and forming together with the second active region a second pn junction, whose photo current generated by light in the visible wavelength range, can be tapped at a first cathode, in particular at an associated (electrically conductive) contact as section or portion of the first cathode.

Under the third active region there is a fourth active region having an n-doping that decreases in the depth of the sensor and forming together with the third active region a pn junction, whose photo current generated by light in the infrared wavelength range, can be tapped at a second cathode. Moreover, between the fourth active region and the substrate, in which the fourth active region is embedded, a pn junction is present, whose photo current—generated by light in the infrared wavelength range—is present together with the photo current of the third pn junction (and can therefore be tapped).

The photo current of the two latter pn junctions can be tapped particular independently of the photo current of the second pn junction, in particular also at a contact region as section or portion of the second cathode.

The third and fourth pn junctions may electrically be connected in parallel and form to portions or regions of a photodiode. In particular the fourth pn junction collects the longwave IR photons and converts the same into electrons. The third pn junction, on the other hand, is of less relevance with respect to its collecting influence.

An anode is provided that is connected, via an associated terminal region, to the active regions surrounding the p-substrate, wherein the surface-near first active region has a doping that corresponds to the doping of the terminal region.

The inventions are not limited to silicon as basic material of the optical sensor. Other materials, for instance GaAs or other semiconductors, may be used for the implementation as well.

In the optical sensors described herein, the photo currents may be provided in positive flow direction, however, any described doping may be converted so that the sensor provides negative photo currents.

The optical sensor, in which photo currents generated by light in the visible wavelength range and light in the infrared wavelength range can be tapped separately at pn junctions of active regions formed in a substrate (52), includes a surface-near active region with a first type of doping.

In a surface-near portion shortwave photons are nearly absorbed, at least block such that these shortwave (high-energy) photons cannot generate photo currents. These reach a short-circuited photodiode or alternatively a cap layer that affects the shortwave photons.

(a) a second active region (14) subjacent to the active region (12) and comprising an inverse type of doping that decreases in the depth of the sensor and forming together with the first active region (12) a—in particular short-circuited—first pn junction (22) that is short-circuited;

or (b) an optically effective cap layer that is insulated with respect to the active region (12) and that is located below the polysilicon layer and absorbs shortwave photons such that these do not contribute to the photo currents.

The IR wavelength range is detected in a deep-lying region and is converted into photo current. To this end, two deep pn junctions are formed.

A fourth active region located below the third active region and having a type of doping that corresponds to the second active region and decreases in the depth of the sensor, forms together with the third active region and the substrate a third pn junction (25, 29) that includes two portions positioned in different depths. The pn junction is electrically connected to a second cathode (28) electrically isolated from the first cathode (18) in order to allow tapping the photo current—generated by the light in the infrared wavelength range at the third pn junction—at the second cathode (28).

The visible light is coupled out as photo current, as in the previously described embodiments.

Finally, the problem is solved according to a still further embodiment, wherein photo currents generated by light in the visible wavelength range and light in the infrared wavelength range are to be tapped separately at pn junctions of active regions formed in a p-substrate. The optical sensor comprises a surface-near first active region having a high p+ doping that decreases in the depth of the sensor and a second active region subjacent to the first active region, which has an n-doping that decreases in the depth of the sensor and which forms a first pn junction together with the first active region. The first pn junction is short-circuited. Subjacent to the second active region there is provided a third active region including a p-doping that decreases towards the second active region and forming together with the second active region a second pn junction, whose photo current—generated by light in the visible wavelength range—is present at a first cathode. Subjacent to the third active region there is provided a fourth active region including an n-doping that decreases in the depth of the sensor and forming together with the third active region a third pn junction, whose photo current—generated by light in the infrared wavelength range—is present at a second cathode and can be tapped there. By means of a terminal region an anode is connected to the p-substrate that surrounds the active regions.

In the inventive sensor the spectral characteristics of the two cathode currents are achieved by means of accordingly designed doping profiles.

By means of the surface-near arranged first pn junction it is achieved that the photo current of the surface-near absorbed photons is cancelled. Due to the absorption characteristics of silicon this is equivalent to the suppression of any shortwave photo-generated charge carriers.

Together with the third active region the second active region forms the third pn junction, whose photo current generated by light in the visible wavelength range is present at the second cathode. Since the fourth active region is embedded in the adjacent p-substrate, a fourth pn junction, whose photo current generated by light in the infrared wavelength range is also present at the second cathode, is formed between the fourth active region in the p-substrate.

The invention will be illustrated by means of examples and not in a manner, with which limitations from the figures may be read into the claims. Examples remain examples, even if a "for example" is not used in combination with every sentence. It is asked that this should be taken into consideration during an understanding study by the respective person skilled in the art.

BRIEF DESCRIPTION OF THE DRAWINGS

Same reference signs in the figures indicate same or at least similar elements.

Figure 1:
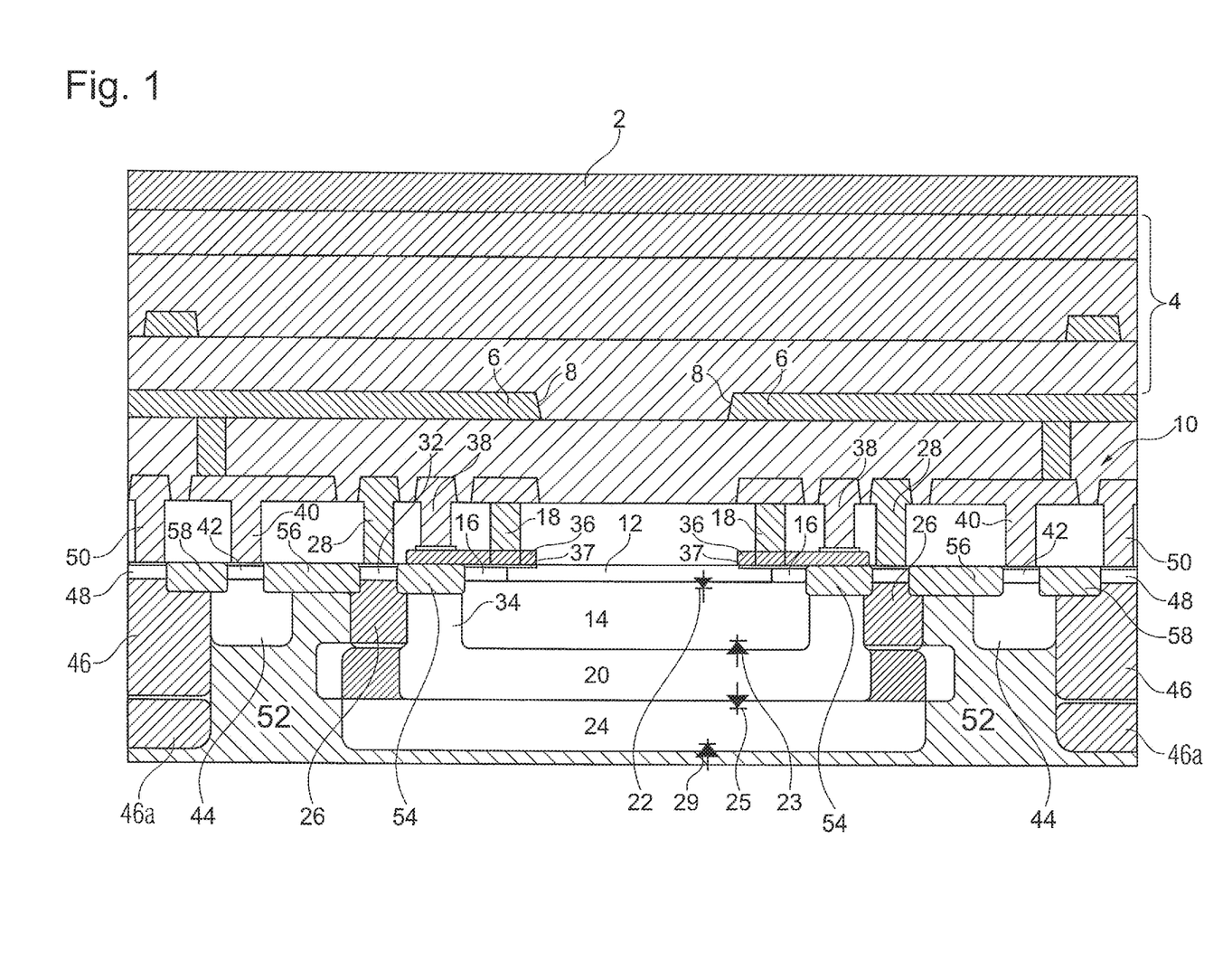
FIG. 1 is a perpendicular section of a first exemplary embodiment of the optical sensor.

FIG. 1 shows a schematic cross-sectional illustration of a first exemplary embodiment of the optical sensor. This sensor shall be explained by way of example of a device manufactured in a CMOS process.

To this end, firstly the structure of the sensor is illustrated in FIG. 1.

The sensor comprises at its surface an $Si_3N_4$ passivation layer 2, thereunder at least one or more cap layer(s) 4 and thereunder a metallization layer that forms a shielding 6 with respect to radiation incident on a subjacent part of the sensor. The shielding 6 has an entry opening 8 for incident light. A wiring layer 10 is located below the shielding 6 and includes lines connecting to the active regions of the sensor.

The light entering the sensor through the entry opening 8 is incident on a first active region 12 having p+ doping, which is formed as a large area PIMP implantation region. The doping of the PIMP implantation region 52 is significantly higher (3 to 7 orders of magnitude) than the doping of the p-substrate.

Below the first active region 12 there is formed a second active region 14 as an N-well region that is connected to a first contact 18 by an n+ contact ring 16 that surrounds the first active region 12 with the first contact 18 being part (as a cathode portion) of a first cathode of n-doped regions connected thereto. The n+ contact ring 16 for example consists of silicide. The first active region 12 and the second active region 14 are therefore connected at the edge via the n+ contact ring 16 by an ohmic contact, thereby being routed out, as a part of the first cathode, to the first contact 18.

In the following the first contact 18 and the term first cathode are used synonymously and are denoted by the same reference sign.

Between the first active region 12 and the second active region 14 there is a first pn junction 22 that is short-circuited. Here, it is referred to FIG. 10, at the first intersection of the PIMP doping profile with the N-well profile (upper left portion in the figure, in low depth).

Below the second active region 14 there is provided a third active region 20 as DP-well region, that is, as a deep P-well that forms a second pn junction 23 together with the second active region 14. Also in this case it is to be referred to FIG. 10, at the second intersection, here the N-well doping profile with the DP-well doping profile (at increased depth as diode 22).

Below the active region 20 there is provided an active region 24 as TN-well region (tail N-well region=tapering N-well region) that is connected by an N-well terminal region 26 with a second contact 28, which forms together with the n-doped regions connected thereto a second cathode that hereinafter will be denoted with the same reference sign as the contact 28.

The active region 20 in combination with the active region 24 forms a pn junction 25, whose photo current generated by light in the visible wavelength range is present at the second cathode 28. Also in combination with the substrate 52 the active region 24 forms a pn junction 29 that in terms of potential is connected in parallel to the pn junction 25 and that also provides its photo current to the second cathode 28. Also in this case it is to be referred to FIG. 10, at the third and fourth intersections, at the N-well doping profile with PSub (forming the diode 29) and at the DP-well doping profile (forming the diode 25), both located at deeper depth as diode 23.

The N-well terminal region 26 encloses the active region 14 and provides contact to the active region 24 by regularly distributed contact areas. Therefore, the active region 24 is not connected in a circumferential manner by the N-well terminal region 26, but punctually.

The punctual contact regions 24/26 are to provide a direct connection from the active region 20 to the surrounding p substrate PSub 52 (not visible there). The doping of the active region 20 is masked at the contact areas of the N-well terminal region 26 in order to maintain the contact between the N-well terminal region 26 and the active region 24. The interruption(s) of the region 26 (it is an n-region) allows the region 20 (it is a p-region) to be in direct contact with the region 52 (substrate, also a p-region). Here, an identical potential of the regions 20 and 52 is created.

The active region 24 is connected to the second cathode 28 by an n+ contact ring 32. The active region 14 and the N-well terminal region 26 are isolated from each other by a P-well region 34.

Since the active region 24 is embedded in the adjacent p-substrate 52, the pn junction 29 is formed between the active region 24 and the P-substrate, whose photo current generated by light in the infrared wavelength range, is also present at the second cathode 28. The pn junctions 25 and 29 are, as discussed above, electrically connected in parallel, since the region 20 is at the same potential as the substrate 52 (due to the merely punctual contact regions 24/26 and the direct contact of the regions 20 and 52 achievable by this fact).

A polysilicon layer 36 covers the first active region 12 at least partially and is isolated with respect to the active regions of the sensors, in particular with respect to the first active region 12 and the n+ terminal region 16, by means of an oxide layer 37. The polysilicon layer 36 has a connection at only some points between an outer portion, at which the polysilicon layer 36 is connected by means of a contact 38, and an inner portion above the first active region 12 in order to establish the contact to corresponding n-regions without forming a short-circuit with the polysilicon layer 36.

Furthermore, the sensor includes an anode having a contact 40 that is connected by a p+ contact ring 42 that establishes the contact to a P-well terminal region 44 embedded in the p-substrate, thereby ensuring the substrate contact. Hereinafter, the anode and its (electrically conductive) contact are denoted by the same reference sign 40.

A fifth active region 46 and 46a as N-well-TN-well region surrounds the entire active structure of the sensor and serves as the shielding against external influences. Here, an NIMP doping region is enclosed by an N-well-TN-well doping region, thereby forming a pn junction penetrating as deeply as possible.

The fifth active region 46 is connected to a shielding electrode 50 by an n+ contact ring 48.

The described active regions are embedded in the p-substrate (PSub) 52.

Finally, for isolation purposes trench isolations 54, 56, 58 (STI=shallow trench isolation) are arranged between the contact rings 16, 32, 42, 48 of the active regions.

In the sensor of the first exemplary embodiment the photo currents are provided in positive flow direction. However, any described doping may be inverted so that the sensor may exclusively provide negative photo currents.

In the following the steps are explained for manufacturing the sensor of the first exemplary embodiment according to the CMOS process.

Firstly, the deepest TN-well implantation is performed. Accordingly, the fourth or the lowest active region 24 is formed. This TN-well implantation is, for instance, performed with phosphorus at an energy of several MeV and an implantation angle of 0°, thereby deeply penetrating due to the channeling effects and forming a pn junction below a depth of 5.5 µm in a p-doped substrate (as a wafer) with a doping concentration of $2e^{15}$.

Next, the third or deep active region 20, i.e., the DP-well, is formed. This will be accomplished in several implantation steps, since, on the one hand, the peak concentration could be located as deeply as possible in the silicon, and on the other hand the doping concentration profile should decrease steadily towards the second or next higher pn junction 23. For that matter a doping concentration in the third active region 20 should be higher than the doping concentration in the fourth active region 24 in order to avoid the formation of an undesired pn junction that could form above the pn junction.

Following these deep implantations a shallower implantation is performed so as to complete the active regions. The N-well and PIMP implantations being part in the respective CMOS process may be used as long as the N-well 14 reaches at least a depth of 1.5 µm and the PIMP pn junction to the N-well is located above a depth of 0.5 µm.

The sensor is configured to be mainly symmetrical. In principle, it may take any shape, however, a round or quadrangular shape with chamfered edges (octagon) is preferred due to the reduced leakage currents.

Figure 2:
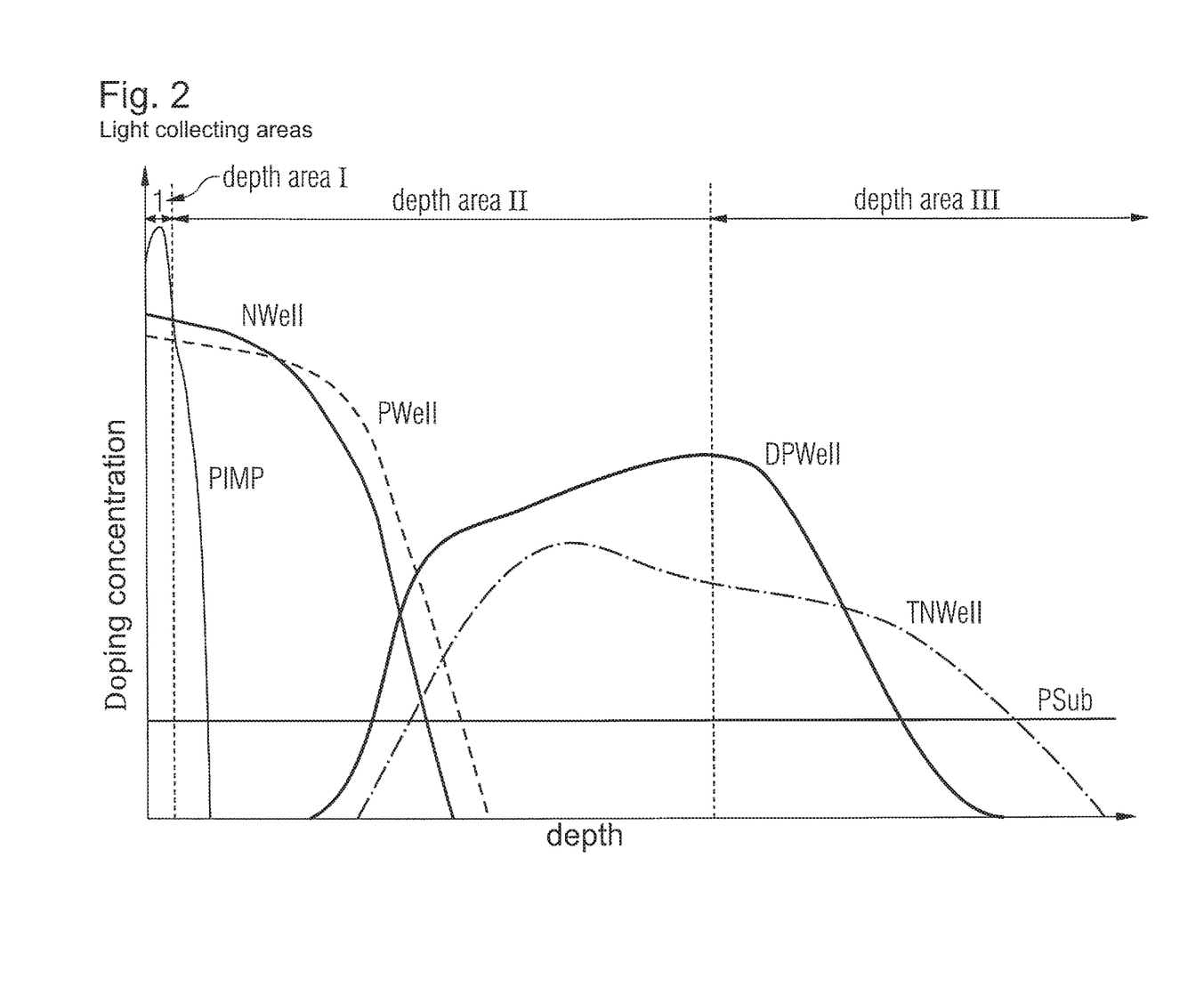
FIG. 2 are doping profiles obtained in separate depth areas I, II and III of the sensor of FIG. 1.

FIG. 2 illustrates examples of doping profiles obtained in separate depth areas of the sensor. In FIG. 2 the curve PIMP illustrates the doping profile of the implantation of the first active region, the curve N-well illustrates the dopant profile of the implantation of the second active region, the curve DP-well illustrates the dopant profile of the implantation of the third active region, the curve TN-well illustrates the dopant profile of the implantation of the fourth active region and the curve PSub illustrates the doping of the substrate (wafer). The doping profiles are shown in three height areas, in which light of different wavelengths is converted into photo currents.

The shortwave light of wavelengths less than approximately 425 nm is converted in the first area I. The visible light of wavelengths between 450 nm and 675 nm is converted in the second depth area II, while the longwave light of wavelengths greater than approximately 675 nm is converted in the third area III.

As is evident from FIG. 2 the first active region 12 has a p+ doping that decreases towards or in the depth of the sensor. The second active region has an n-doping that decreases in the depth of the sensor. The third active region has a p-doping that decreases from its peak value towards the second active region. The fourth active region again has an n-doping that decreases in the depth of the sensor. As is also evident from FIG. 2 the doping concentration of the fourth active region 24 in the second depth area II is less than the doping concentration in the third active region 20 so as to avoid a pn junction, which would be obtained for a reversed doping concentration.

Figure 3:
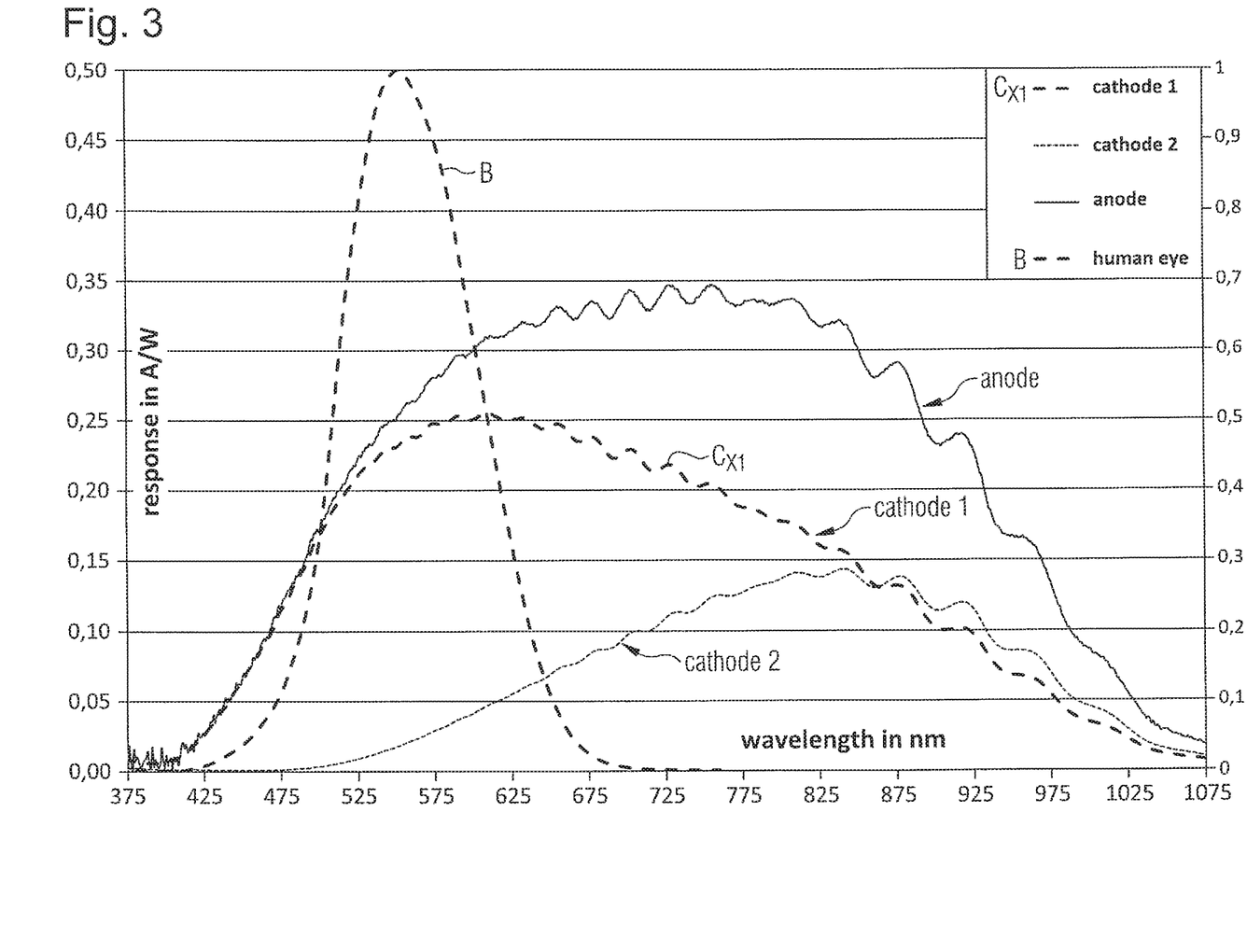
FIG. 3 are several graphs of the response (A/W versus the wavelength λ) of the sensor of FIG. 1.

FIG. 3 illustrates the measured spectral response of a sensor according to the first exemplary embodiment.

The measured photo currents and for comparison the light sensitivity B of the human eye are illustrated at the first contact (the first cathode 18), in the figure denoted as cathode 1 or $C_{x1}$, at the second contact (the second cathode 28), in the figure denoted as cathode 2, and at the contact (the anode 40), in the figure denoted as anode.

From the illustration it is evident that at the first contact or the first cathode 18, respectively, mainly the photo current generated by photons in the visible wavelength range and at the second contact or cathode 28, respectively, mainly the photo current generated by photons in the infrared wavelength range are tapped. The photons in the wavelength range below 425 nm are completely blocked and do not provide any measurable photo current.

Figure 4:
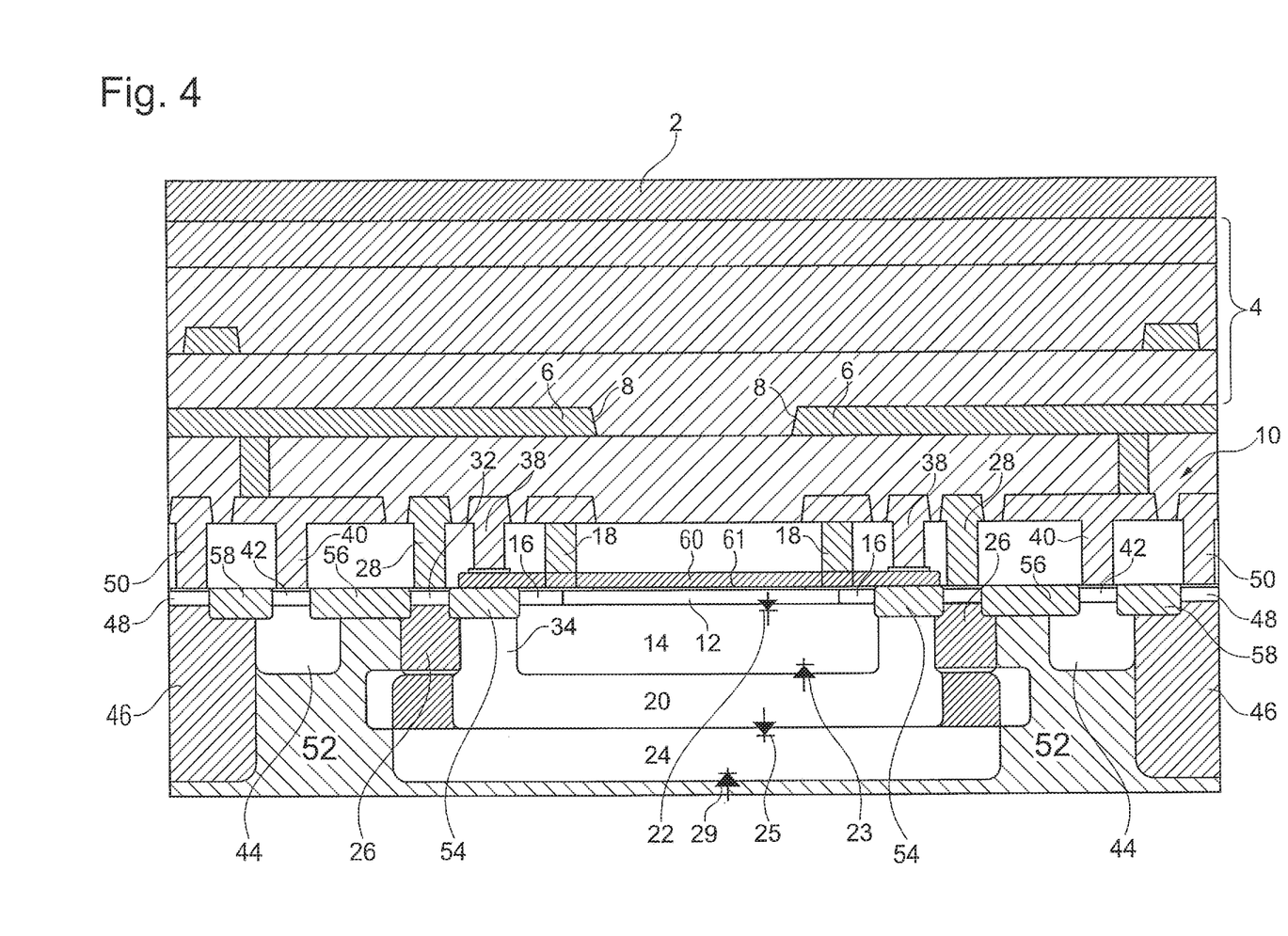
FIG. 4 shows a perpendicular section of a second example of the optical sensor having a continuous polysilicon layer 60 (poly) at its surface.

FIG. 4 illustrates a second exemplary embodiment of the sensor. The sensor of the second exemplary embodiment is substantially of the same structure as the sensor of the first exemplary embodiment, and therefore corresponding features in FIGS. 1 and 4 have the same reference signs and will not be described again.

The sensor of this example is different from the sensor of the first example in that above the surface-near first active region 12 a non-silicided polysilicon layer 60 (denoted as "poly") is arranged that is electrically isolated from the active regions of the sensor, for instance by an insulation layer 61 (as gate oxide).

Figure 5:
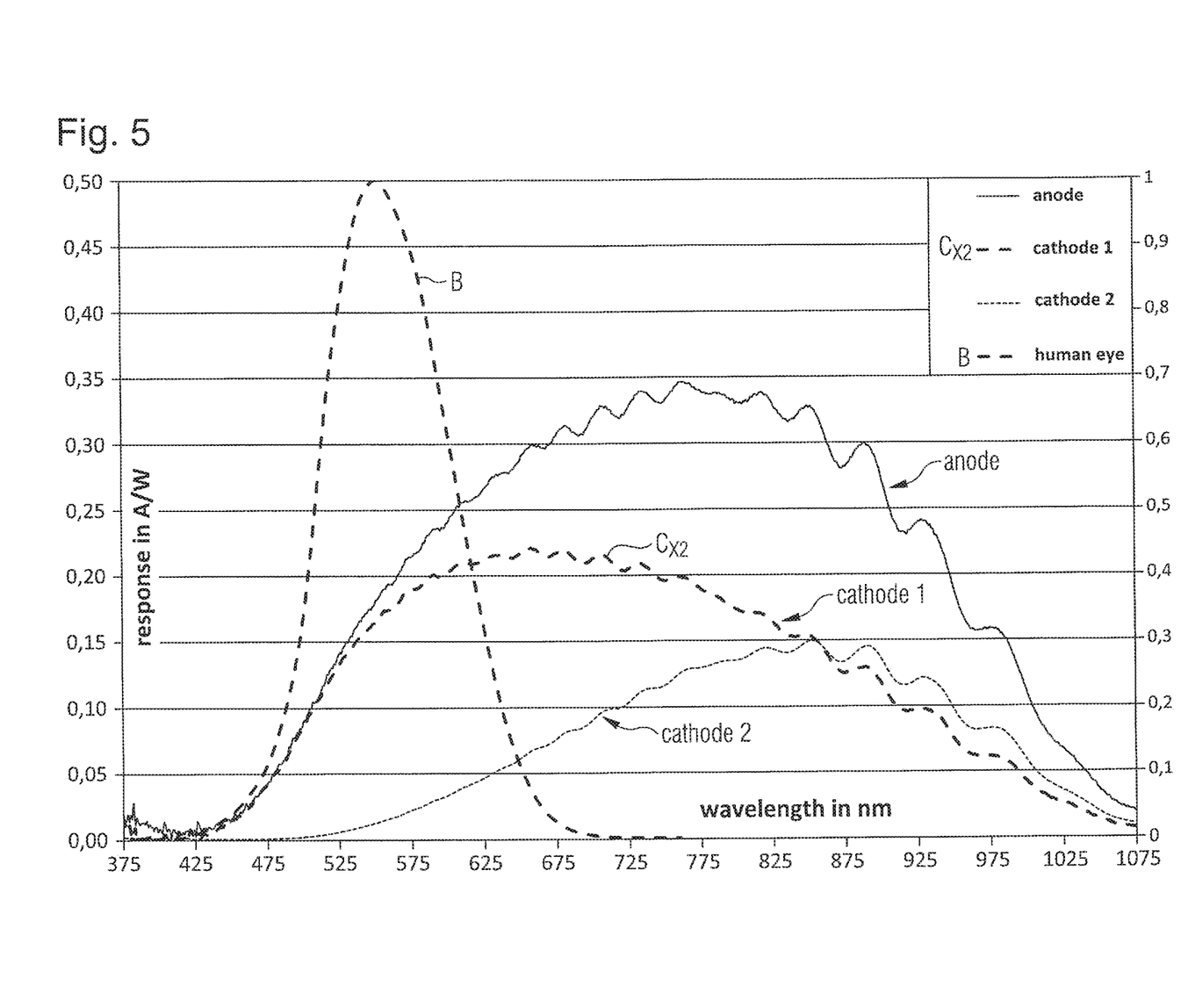
FIG. 5 are graphs cathode 1, cathode 2 and anode in comparison to the progression of the sensitivity of the human eye and the response of the sensor of FIG. 4.

FIG. 5 illustrates the measured spectral response of a sensor according to the second exemplary embodiment in an illustration corresponding to FIG. 3, wherein the influence of non-silicided poly layer with a thickness of 200 nm above the first active region 12 is illustrated. Graph $C_{x2}$ is a representation of cathode 1 for this embodiment.

Also from this illustration it is evident that at the first contact 18 and thus at any arbitrary position of the first cathode 18 mainly a photo current generated by photons in the visible wavelength range and at the second contact 28 and thus at any arbitrary position of the second cathode model 28 a photo current generated by photons in the infrared wavelength range are tapped. The photons in the wavelength range below 425 nm are completely suppressed and do not provide any measurable photo current.

Figure 6:
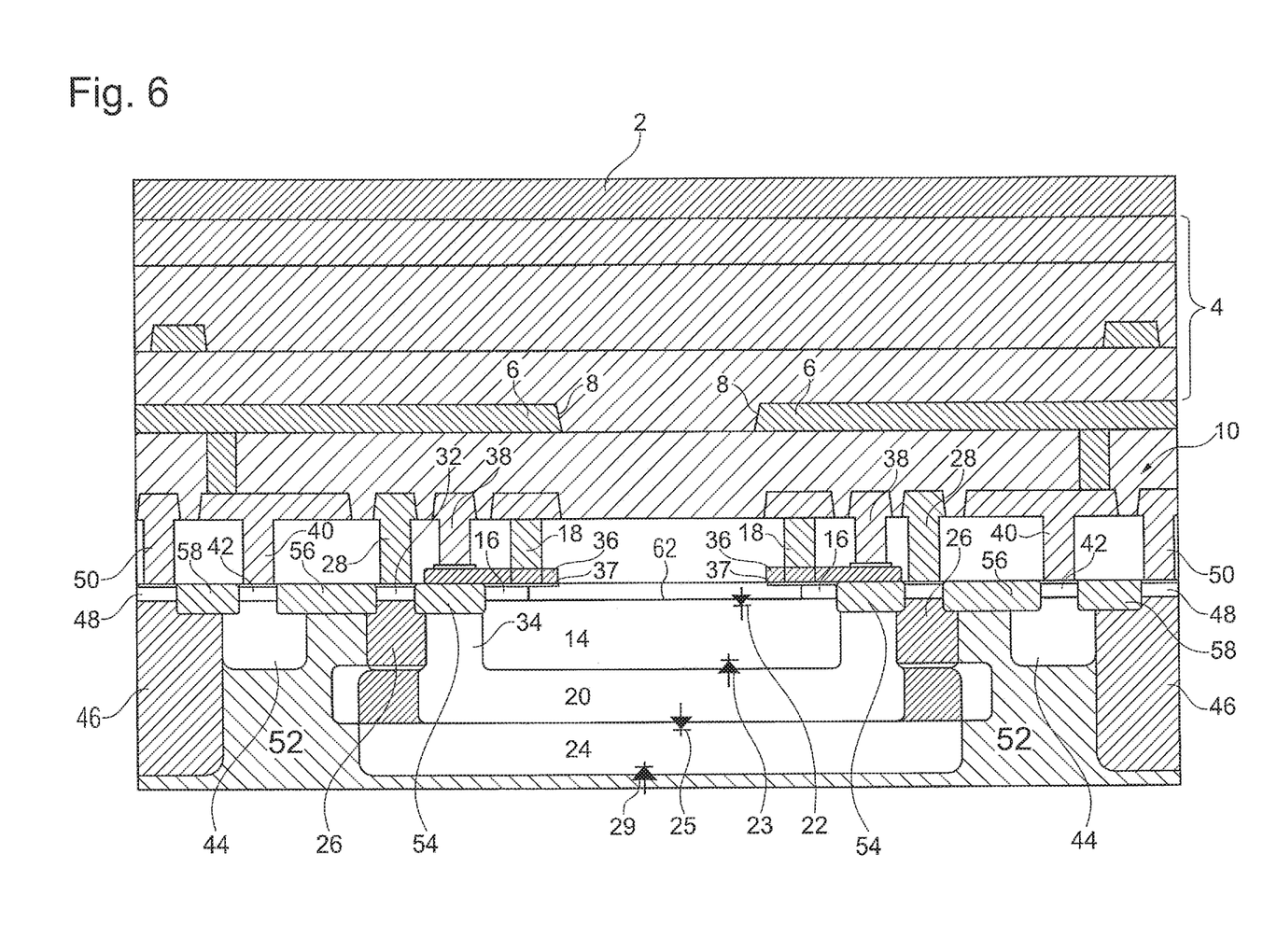
FIG. 6 is a perpendicular section of a third exemplary embodiment of the sensor having a p-doped region 62 at its surface.

FIG. 6 illustrates a sensor of a third exemplary embodiment. The sensor of the third exemplary embodiment is substantially the same structure as the sensor of the first exemplary embodiment, and therefore the corresponding elements in FIGS. 1 and 6 have the same reference signs and will not be described again.

The sensor of the third exemplary embodiment is different from the sensor of the first exemplary embodiment in that the surface-near first active region 62 comprises a p-doping, whose concentration is the same as that of the doping of a terminal region 44 of the anode 40. The first active region 62 in the third exemplary embodiment is doped more highly as the first active region 12 in the first and second exemplary embodiments and therefore forms a somewhat deeper-lying pn junction compared to the sensor of the first and second exemplary embodiments, however, does not require any additional implantation and masking level.

Figure 7:
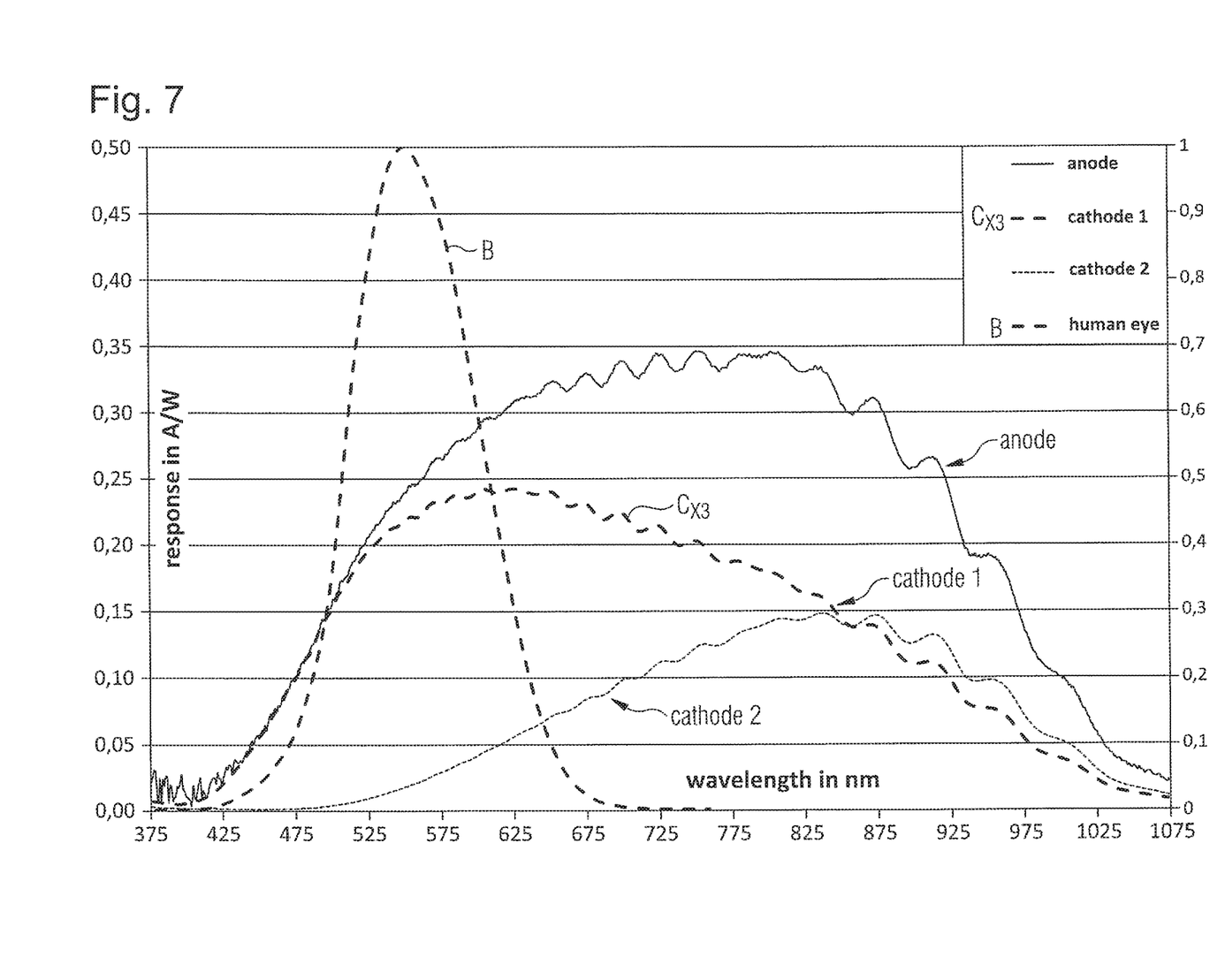
FIG. 7 are graphs of the response of the sensor of FIG. 6.

FIG. 7 illustrates the measured spectral response (the "Response") of a sensor according to the third exemplary embodiment in an illustration corresponding to FIG. 3. Graph $C_{x3}$ is a representation of cathode 1 for this embodiment. The influence of the first active region 62 is illustrated, when the first active region 62 has a p-doping, the concentration of which is equivalent to that of the doping of a terminal region 44 of the anode 40, 44 that includes the contact 40. Also, from this illustration it is evident that at the first contact 18 and thus at any arbitrary position of the first cathode mainly the photo current generated by photons in the visible wavelength range and at the contact 28 and the thus at any arbitrary position of the second cathode mainly a photo current generated by photons in the infrared wavelength range are tapped. The photons in the wavelength range below 425 nm are completely suppressed and do not provide any measurable photo current.

Figure 8:
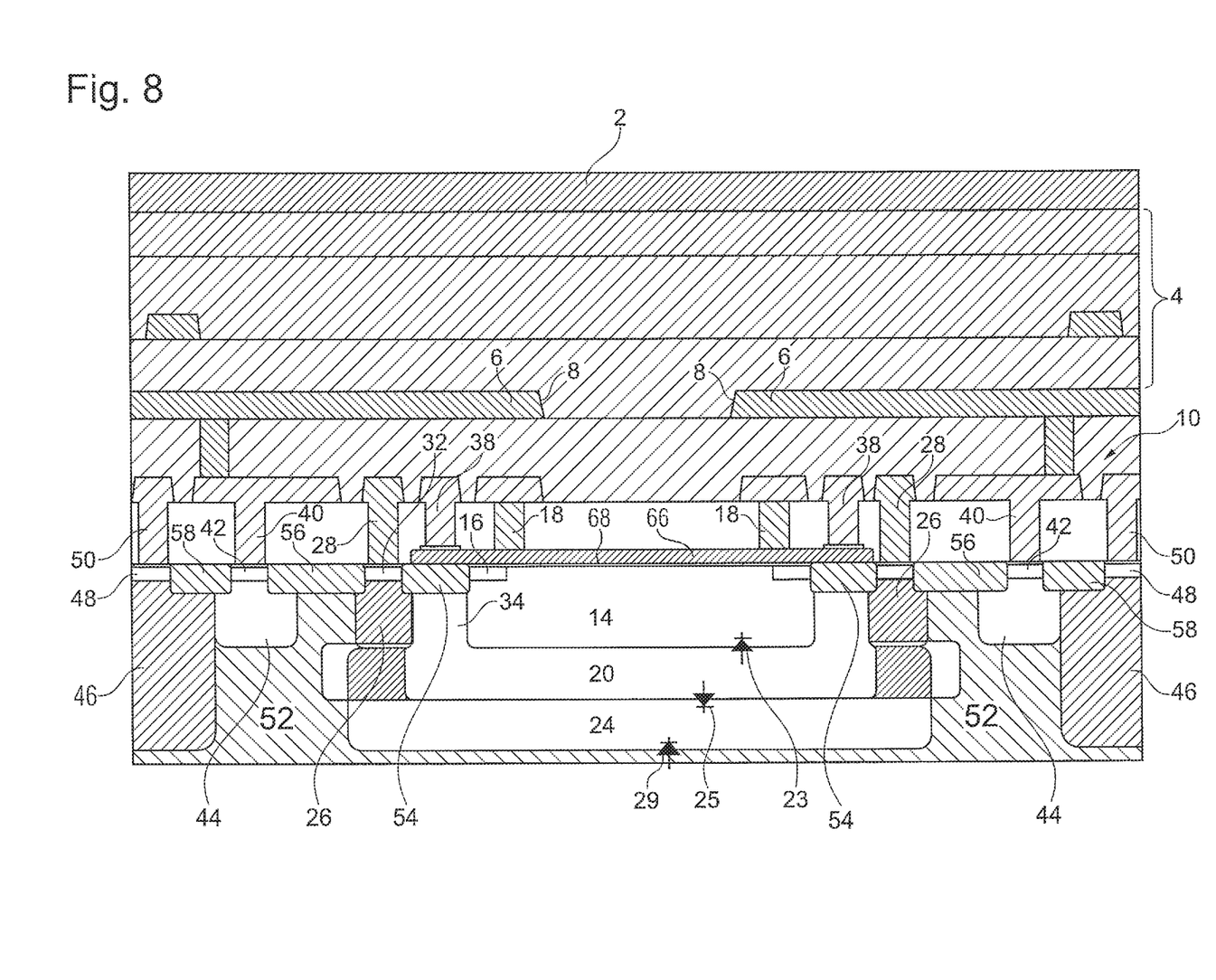
FIG. 8 illustrates a perpendicular section of a fourth exemplary embodiment of the sensor having a polysilicon layer 36 at its surface.

FIG. 8 illustrates a particular section through a fourth exemplary embodiment of the sensor. The sensor of the fourth exemplary embodiment has substantially the same structure as the sensor of the first exemplary embodiment, and therefore the coinciding elements in FIGS. 1 and 8 have the same reference signs and will not be described again.

The sensor of the fourth exemplary embodiment is different from the sensor of the first exemplary embodiment in that a continuous polysilicon layer 66 is located directly above the second active region 14 and is isolated with respect to the second active region 14 by an oxide layer 68 (as gate oxide). Here, the first active region 12 is not provided.

By means of a polysilicon layer as a cap layer 66 a shift into the visible range of the shortwave wavelength to be suppressed is obtained, since the high-energy photons are already proportionally absorbed within this cap layer 66, and since this polysilicon layer 66 is electrically isolated from the silicon of the sensor by the oxide layer 68, charge carriers cannot contribute to the photo current.

Also, the sensor of the fourth exemplary embodiment is different from the sensor of the first and third exemplary embodiments in that the first active region 12 or 62 is omitted and functionally replaced by the cap layer 66—coupling out the high-energy photons from the incident light. The cap layer 66 completely covers the following active region 14. These options of the optically effective cap layer and the surface-near positioned pn junction (that is short-circuited) may be used separately or also in combination.

None of the examples is restricted to silicon as basic material of the sensor. Other materials, for instance GaAs and other semiconductors, may also be used for the implementation of the examples.

Figure 9:
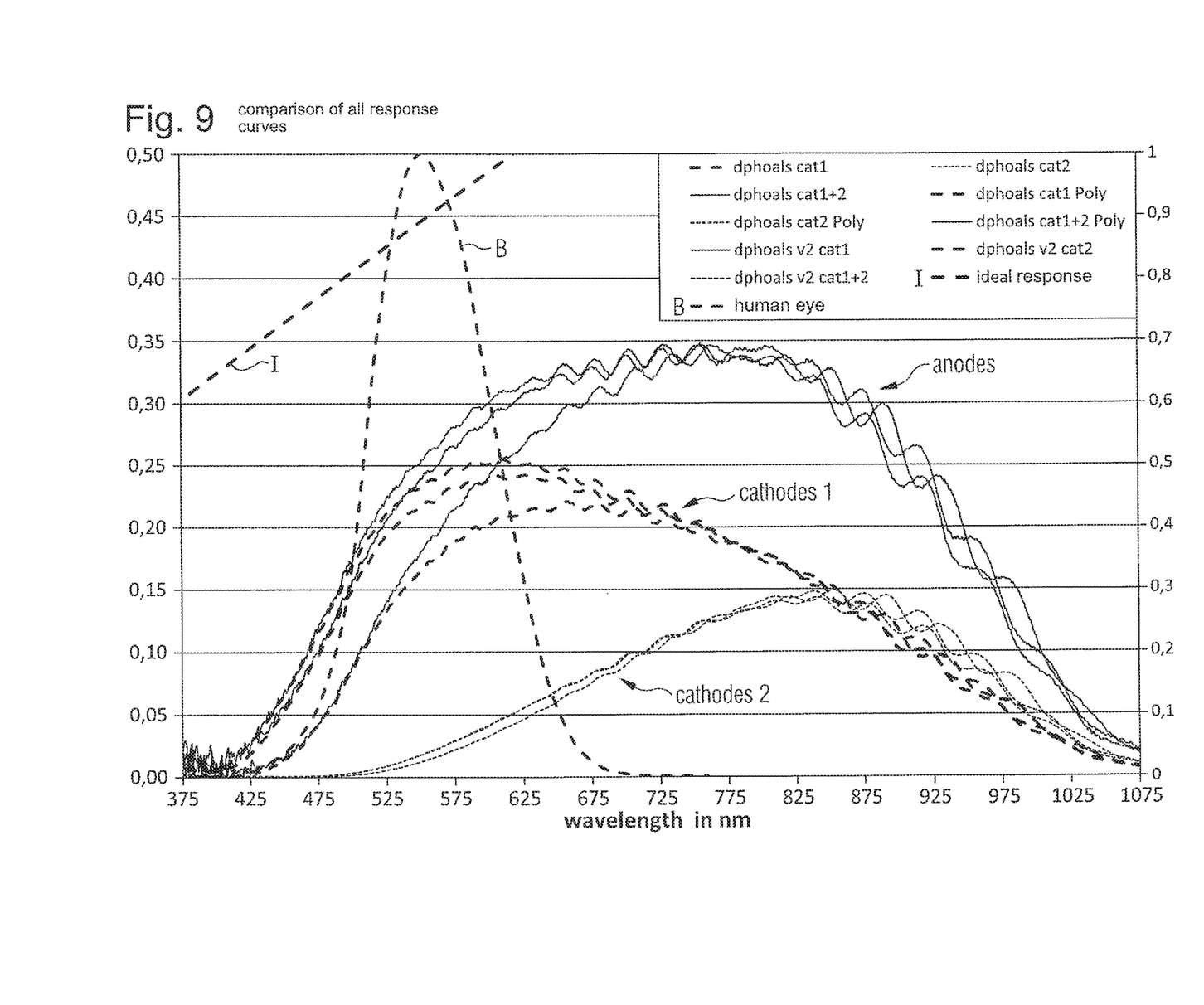
FIG. 9 are graphs of the different responses of the sensors of the above figures.

FIG. 9 comprehensively compiles in an internal comparison the response of the three sensors. These are the graphs of FIGS. 3, 5 and 7. Also, for comparison with the graph B of the response of the human eye between 425 nm and 725 nm and the ideal response I. Corresponding graphs are grouped as "anodes", "cathodes 1" and "cathodes 2". Each group showing three graphs corresponding to the three examples represented in FIGS. 3, 5 and 7.

Figure 10:
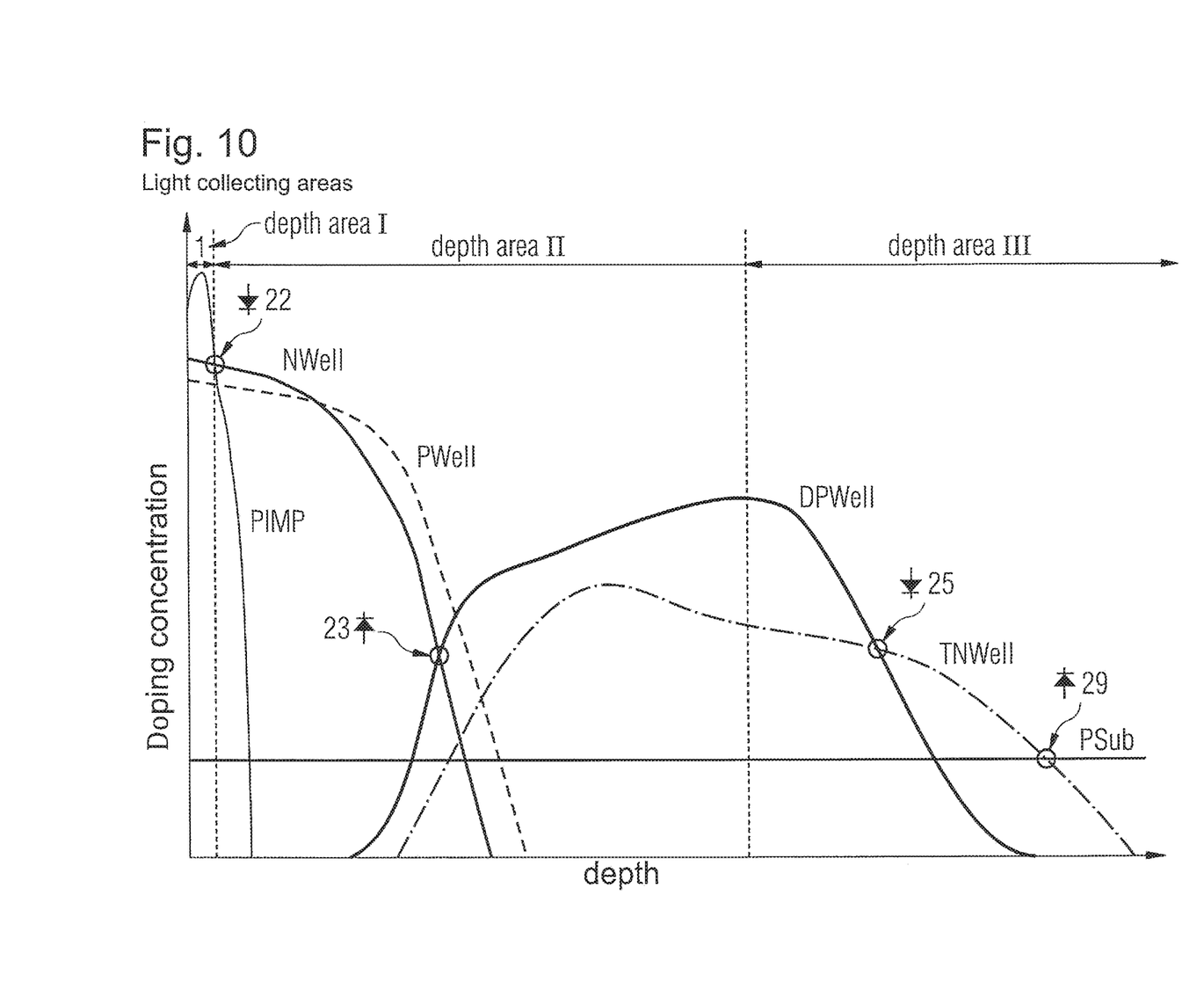
FIG. 10 is a clarified version of FIG. 2 with an indication of the depth location of the pn junctions.
Figure 11:
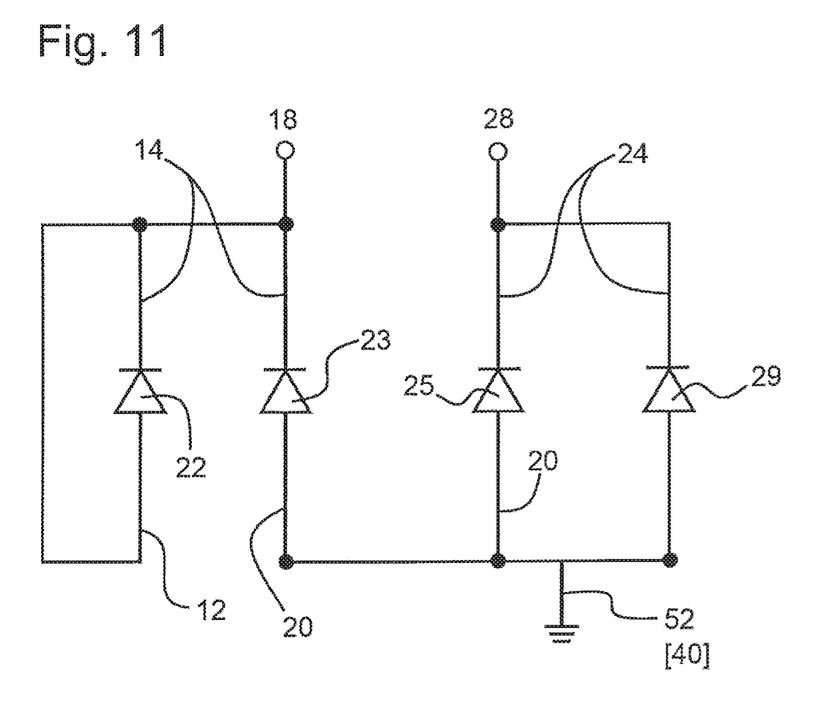
FIG. 11 is an equivalent circuit of the diode configuration of the stacked pn junctions.

FIG. 10 and FIG. 11 have already been introduced and discussed in the context of the structural description of the layer structure of FIGS. 1, 4, 6 and 8. These figures are attached here in order to provide further clarification of the disclosure of the previous exemplary embodiments and for the skilled person, to whom this addendum relates.

Firstly, to this end the depth profile of the doping concentration, which is frequently denoted as "doping", is provided, meaning the concentrations to be seen in FIG. 2. The intersections of different depth concentrations result in diodes shown in said FIGS. 1, 4, 6 and 8, which are formed at respective interfaces between two layers of different type of doping, for example between the first active layer 12 (in the description also referred to as active region) and the second active region 14 for forming the diode 22. In FIG. 10 this is the intersection of the doping concentration PIMP and the N-well at the end of the first depth area. In the illustration of FIG. 8 the uppermost diode 22 is missing, which is relevant only for the examples of the other FIGS. 1, 4 and 6.

In the second depth area there is again an intersection, here between N-well and DP-well, for forming the diode 23. This is in the depth area II. In the depth area III two diodes are formed, since here two intersections exist between respective inverse types of doping. The diode 25 (intersection of TN-well and DP-well) is located in the intersection between the active region 20 and the active region 24. The diode 29 (intersection of TN-well and PSub) is formed between the active region 24 and the substrate 52. These two diodes 25 and 29 are electrically connected in parallel and provide their signals at the second cathode 28 opposite to the anode 40, which is electrically conductively connected to the substrate 52 through the terminal region 44.

The diode 25 is formed at the intersection between DP-well and TN-well, wherein the doping concentration of DP-well to the diode 25 and the transition zone between the active regions 20 and 24 is always above the doping concentration of PN-well. The diode 29 connected to the diode 25 is formed in the intersection of the doping concentration TN-well and the substrate 52. These diodes are illustrated in FIGS. 1, 4, 6 and 8 and are respectively discussed there.

The electric circuitry of the diodes is evident from FIG. 11.

FIG. 11 illustrates the diodes 22, 23, 25 and 29 and their associated connection to the substrate and the anode at the lower end of the figure and at the two cathodes 18 and 28 at the upper end. Also, it becomes evident here that the first diode 22 is electrically short-circuited between the two active regions 12, 14 in order to neutralize the portion of the UV radiation with respect to current created therefrom. This diode would be missing in the equivalent circuit of the embodiments of FIG. 8.

Evidently, the areas and active regions can be recognized that are denoted by the same reference signs. 52 is the substrate and 24 is the most deeply located active region of the active regions 12, 14, 20 and 24. Furthermore, it is evident that the two diodes 25 and 29 are electrically connected in parallel in order to be electrically connected with their anode from substrate to the cathode 28, i.e., the second cathode.

In this case, the assumption previously made above several times that the diode direction is inverted for an opposite type of doping may be applied, and this also applies for nomenclature of anode into cathode, which will be manifested in a corresponding inverted diagram of FIG. 11 as an electric equivalent circuit diagram, which, however, is not specifically illustrated here.

In the optical sensors provided in the example of FIGS. 1, 4, 6 and 8 the photo currents illustrated therein with positive flow direction may also be provided as negative photo currents, when each one of the accordingly described doping of the active regions is reversed. In this manner, a corresponding inverted electrical equivalent circuit diagram of FIG. 11 is obtained, which is not specifically illustrated here.

What is claimed is:

1. Optical sensor for providing photo currents produced by light in the visible wavelength range and light in the infrared wavelength range and configured for being tapped separately at pn junctions of active regions formed in a p-substrate (52), wherein the sensor comprises:
   a continuously arranged polysilicon layer that is isolated with respect to an active region (12, 14) located below the polysilicon layer and having an n-doping that decreases in the depth of the sensor;
   a further active region (20) subjacent to the active region (12, 14) and having a p-doping that decreases towards the active region (12, 14) and forming together with the active region a pn junction (23), a photo current thereof produced by light in the visible wavelength range for being tapped at a first cathode (18);
   a still further active region (24) subjacent to the further active region (20) and having an n-doping that decreases in the depth of the sensor and forming together with the substrate (52) a pn junction (29), a photo current thereof produced by light in the infrared wavelength range for tapping at a second cathode (28);

an anode (40) connected to the p-substrate (52) via a terminal region (44), the substrate surrounding the active regions.

2. The optical sensor according to claim 1, wherein the still further active region (24) subjacent to the further active region (20) and having the n-doping that decreases in the depth of the sensor forms together with the further active region (20) also a pn junction (25), whose photo current, produced by light in the infrared wavelength range for being tapped at a second cathode (28), thereby electrically connecting the two pn junctions (25, 29) in parallel.

3. The optical sensor according to claim 1, wherein the first pn junction (22) is located at 0.2 μm to 0.5 μm measured from the top surface or the surface of the active portion of the sensor or is separated therefrom by said measure.

4. The optical sensor according to claim 1, wherein a peak doping concentration of the doping profile of the third active region (20) is located at 3 μm to 5 μm and defines a boundary for the proportion of the visible photons.

5. The optical sensor according to claim 1, wherein the polysilicon layer (60) has a thickness between 100 nm to 300 nm in order to be adapted and appropriate for at least largely absorbing a UV portion of the incident light.

6. The optical sensor according to claim 1, wherein the infrared photo current can be tapped or is present at the second cathode (28) independent of a photo current generated from visible light in the pn junction (23) between the first active region (14) and the further active region (20).

7. Optical sensor for providing photo currents produced by light in a visible wavelength range and light in an infrared wavelength range and configured for being tapped separately at pn junctions of active regions formed in a substrate (52) of a first type of doping, wherein the sensor comprises:

a continuously arranged polysilicon layer, isolated with respect to an active region (14) located below the polysilicon layer and the active region having a doping that decreases in a depth of the sensor and is opposite to the first type of doping;

a further active region (20) subjacent to the active region (14) and having a doping that decreases towards the active region (14), has the first type of doping and forming with the active region a pn junction (23), a photo current thereof produced by light in the visible wavelength range for being tapped at a first cathode (18);

a still further active region (24) subjacent to the further active region (20) and having a doping that decreases in the depth of the sensor, is opposite to the first type of doping and forms with the substrate (52) a further pn junction (25,29), a photo current thereof produced by light in the infrared wavelength range for tapping at a second cathode (28);

an anode (40) connected to the substrate (52) via a terminal region (44), the substrate surrounding the active regions from below.

8. The optical sensor according to claim 7, wherein the pn junction (23) is located at 0.2 μm to 0.5 μm, measured from a top surface of an active portion of the sensor.

9. The optical sensor according to claim 7, wherein a peak doping concentration of a doping profile of the further active region (20) is located at 3 μm to 5 μm, measured from a top surface of an active portion of the sensor and defines a boundary for photons of light having the visible wavelength.

10. The optical sensor according to claim 7, wherein the polysilicon layer (60), isolated from the active region and having a thickness between 100 nm and 300 nm for substantially absorbing light in the UV wavelength range, whereby the polysilicon layer shifts the UV wavelength to the range of visible light wavelength and the isolation from the active region provide to avoid a contribution of generated charge carriers to the photo current.

11. The optical sensor according to claim 7, wherein the photo current produced by light in the infrared wavelength range is provided at the second cathode (28) independent of a photo current generated from visible light in the pn junction (23) between the active region (14) and the further active region (20).

\* \* \* \* \*